US007323711B2

(12) United States Patent
Suzuki et al.

(10) Patent No.: US 7,323,711 B2

(45) Date of Patent: Jan. 29, 2008

(54) HIGH-TEMPERATURE SUPERCONDUCTIVE DEVICE

(75) Inventors: Hideo Suzuki, Yokohama (JP); Masahiro Horibe, Tsukuba (JP); Keiichi Tanabe, Mito (JP)

(73) Assignees: FUJITSU Limited, Kawasaki (JP); International Superconductivity Technology Center, the Juridical Foundation, Tokyo (JP)

( * ) Notice: Subject to any disclaimer, the term of this patent is extended or adjusted under 35 U.S.C. 154(b) by 344 days.

(21) Appl. No.: 10/899,313

(22) Filed: Jul. 27, 2004

(65) Prior Publication Data

US 2005/0043185 A1 Feb. 24, 2005

(30) Foreign Application Priority Data

Jul. 29, 2003 (JP) ............................ 2003-202819

(51) Int. Cl.
*H01L 29/06* (2006.01)

(52) U.S. Cl. ............................ 257/31; 257/34; 257/36; 257/39; 257/E39.014

(58) Field of Classification Search ............ 257/31–39, 257/E39.014, E39.016, E39.015
See application file for complete search history.

(56) References Cited

U.S. PATENT DOCUMENTS 5,253,199 A * 10/1993 Gibson ...................... 365/162
6,790,675 B2 * 9/2004 Adachi et al. ................. 438/2

FOREIGN PATENT DOCUMENTS

| | | | |
|---|---|---|---|
| JP | 01283885 | * | 11/1989 |
| JP | 03211777 | * | 9/1991 |
| JP | 2000-353831 | | 12/2000 |
| JP | 2001-244511 | | 9/2001 |

OTHER PUBLICATIONS

Ito et al; "*The improvement of the characteristics of ramp-edge junctions with interface modified barriers*"; Superconductor Science and Technology, vol. 14, 2001, pp. 1052-1055.

* cited by examiner

*Primary Examiner*—Minh-Loan Tran
(74) *Attorney, Agent, or Firm*—Westerman, Hattori, Daniels & Adrian, LLP.

(57) ABSTRACT

A high-temperature superconductive device is disclosed, including a ramp-edge junction. The ramp-edge junction includes a first electrode layer (5) that defines the size of the ramp-edge junction and a second electrode layer (6). The width of the second electrode layer (6) is greater than the width of the first electrode layer (5). The first electrode layer (5) and the second electrode layer (6) touch in part, and are separated via a first insulation layer (7) in remaining part. Because the ramp-edge junction includes the first electrode layer (5) and the second electrode layer (6), the inductance of the ramp-edge junction can be reduced with the critical current density $J_c$ being kept at a high level.

6 Claims, 12 Drawing Sheets

B
A
A'
W1
W2
B'
6
8
7
5

5
6
7
3
2
1
B
B'

HIGH-TEMPERATURE SUPERCONDUCTIVE DEVICE

BACKGROUND OF THE INVENTION

1. Field of the Invention

The present invention generally relates to a high-temperature superconductive device, and more particularly, to a high-temperature superconductive device characterized by an electrode structure which reduces the inductance of ramp-edge junctions used for various digital processing circuits such as a superconductive sampler for measuring a high speed signal and an A/D converter circuit for measuring a high speed or a very small signal.

2. Description of the Related Art

An oxide superconductor such as a Yttrium system superconductor becomes superconductive at a temperature higher than liquid nitrogen temperature. The oxide superconductor requires a less complicated cooling system than does a conventional metal superconductor that requires cooling down to liquid helium temperature. Various applications of the oxide superconductor are recently under intensive study. Japanese Laid-Open Patent Application No. 2000-353831, for example, discloses an example of such studies.

As one of the characteristics of the oxide superconductor, superconductive current easily flows along a Cu—O plane in crystals made of copper (Cu) and oxygen (O). It is preferable that any junction be formed in parallel to the Cu—O plane. The ramp-edge type junction is proposed as such a junction.

There are two types of ramp-edge junctions known in the art. One type of ramp-edge junction includes a barrier layer made of deposited film. The other type of ramp-edge junction includes a barrier layer that is formed by modifying a surface with ion irradiation. Japanese Laid-Open Patent Application No. 2001-244511 and "Superconductor Sci. Tech.", Vol. 14, pp. 1052-1055, 2001, for example, disclose such a ramp-edge junction. Especially, a ramp-edge type interface-modified junction is drawing attention.

The ramp-edge type interface-modified junction is formed as follows. A slant junction interface is formed on a lower electrode. The surface of the slant junction interface is damaged by ion irradiation. An upper electrode is deposited on the slant junction interface. The critical current density $J_c$ needs to be controlled to realize accurate operation of a circuit. It is desired that the junction properties of high-temperature superconductor devices on a substrate be uniform.

The lower electrode layer is fabricated to form ramps in four directions. Ions are applied to the substrate perpendicular thereto to form a uniform damaged layer on the ramps. The device is heated in an oxygen environment, and an upper electrode is deposited. As a result, interface-modified ramp-edge junctions having the same critical current $J_c$ are formed in the four directions. According to the above arrangement, a high-temperature superconductive circuit having uniform properties can be fabricated. Interface-modified ramp-edge junctions may be formed in one, two, or three directions in the same manner.

A single flux quantum (SFQ) circuit can operate at very high speed and with low power consumption. When a SFQ circuit is designed and fabricated, the product ($L\times I_c$ product) between the inductance L and the critical current $I_c$ in a superconductive loop including a Josephson junction needs to be approximately equal to a flux quantum $\phi_0$ ($=2.07\times10^{-15}$ Wb) or $\phi_0/2$.

In this case, the greater the product ($I_c\times R_n$ product) between the critical current $I_c$ and normal-state resistance $R_n$ of the junction used for the SFQ circuit is, the smaller the width of a SFQ pulse is. As a result, the device operates at higher speed. In the case of a high-temperature superconductive interface-modified junction, the $I_c\times R_n$ product can be made high by increasing the critical current density $J_c$.

FIG. 7 is a graph showing the relation between the $I_c\times R_n$ product and $J_c$ as actual data. The graph indicates that the $I_c\times R_n$ product and $J_c$ relate as follows:

$$I_c\times R_n=J_c^{0.2}, \text{ or}$$

$$I_c\times R_n=J_c^{0.5}.$$

The index depends on the state of the high-temperature superconductive interface-modified junction. If $J_c$ is increased, the $I_c\times R_n$ product can be increased.

A conventional superconductive junction device having the interface-modified ramp-edge junction is described below with reference to FIGS. 8A-8G.

As shown in FIG. 8A, a lower electrode layer 52 made of YBCO ($YBa_2Cu_3O_{7-x}$) and an interlayer insulation layer 53 made of $CeO_2$ are deposited on a LSAT substrate 51 in that order using a pulsed laser deposition method.

As shown in FIG. 8B, photoresist is applied on the interlayer insulation layer 53. The applied photoresist is exposed, developed, and processed by reflowing thereby to form a photoresist pattern 54. Ar ions 55 are applied to the layers for ion milling using the photoresist pattern 54 as a mask. Thus, a ramp-edge structure is formed.

As shown in FIG. 8C, Ar ions 57 are applied to exposed ramp 56 in a direction perpendicular to the LSAT substrate 51 thereby to form a damaged layer 58.

As shown in FIG. 8D, an upper electrode layer 59 made of YBCO is deposited using the sputtering method.

As shown in FIGS. 8E through 8G, a bridge unit 60 is formed by processing the upper electrode layer 59 with ion milling. Thus, the basic structure of the interface-modified ramp-edge junction is formed. FIG. 8E is a top view of the interface-modified ramp-edge junction. FIG. 8F is a cross-sectional view along the one-dot chain line A-A' shown in FIG. 8E. FIG. 8G is a cross-sectional view along the one-dot chain line B-B' shown in FIG. 8E.

As described above, the ramps are formed in the four directions by processing the lower electrode layer, and a uniform damaged layer is formed on the ramps by applying the ions in a direction perpendicular to the substrate. As a result, the interface-modified junctions having the same critical current density $J_c$ in the four directions can be formed. Since the critical current densities $J_c$ in a circuit are equal to each other, the circuit can operate correctly.

FIGS. 9A-9C are schematic diagrams for explaining an interface-modified ramp-edge junction in which a ground plane on the substrate is provided thereby to reduce inductance. FIG. 9A is a top view of the interface-modified ramp-edge junction. FIGS. 9B and 9C are cross-sectional views along the one-dot chain lines A-A' and B-B', respectively.

As shown, a ground plane 61 made of YBCO and an insulation layer 62 made of $CeO_2$ are deposited on a LSAT substrate 51 in that order. After forming the layers, the same steps as shown in FIGS. 8A-8G are performed. The inductance can be reduced by providing the ground plane 60.

As described above, the inductance L of the circuit and the critical current $I_c$ of the Josephson junction need to be determined so that the $L\times I_c$ product satisfies the condition ($L\times I_c<\phi_0$). Since the ramp-edge junction is substantially flat with the end of the lower electrode layer being slanted, the upper electrode layer 59 and the lower electrode layer 52 need to be separate by 1 μm or more.

Currently used lithography causes the upper electrode layer 59 and the lower electrode layer 52 to be separated by 3 μm or more, and as a result, the bridge unit 60 is formed. Accordingly, a parasitic inductance is made in series with the junction. If the critical current density $J_c$ of the Josephson junction is made high to increase the $I_c \times R_n$ product, the width of the junction, therefore the width W of the bridge unit 60 need to be made small to obtain the same critical current $I_c$.

If the width W of the bridge unit 60 is made smaller, the ratio of the length thereof to the width becomes greater. As a result, the parasitic inductance becomes greater.

For example, in the case of fabricating a Josephson junction having the same critical current $I_c$ under a condition in which the thickness of the electrode, the length of the bridge unit 60, and the sheet inductance remain unchanged, if the critical current density $J_c$ is made N times, the width of the junction needs to be 1/N times. Thus, the parasitic inductance is made N times.

As a result, if the critical current density $J_c$ is made higher, the loop inductance of the superconductive loop including the Josephson junction is increased. Accordingly, it becomes difficult for the $L \times I_c$ product to satisfy the above condition ($L \times I_c < \phi_0$). The SFQ circuit cannot operate.

To avoid this problem, when a circuit is designed, a junction of high $J_c$ is not used. The inductance is determined based on a sub-circuit in the circuit, the $L \times I_c$ product of which needs to satisfy the most severe condition. The width of the junction is made great so as to reduce the effect of the parasitic inductance.

However, if the width of the junction is made great to reduce the effect of the parasitic inductance, the critical current density $J_c$ of the Josephson junction cannot be made great, and the $I_c \times R_n$ product becomes relatively small. As a result, the width of the SFQ pulse is made wide which results in low operating speed and unstable operation (jitter) of the SFQ circuit.

SUMMARY OF THE INVENTION

Accordingly, it is a general object of the present invention to provide a novel and useful high-temperature superconductive device in which one or more of the problems described above are eliminated.

Another and more specific object of the present invention is to provide a high-temperature superconductive device in which the inductance of the bridge unit is reduced while the critical current density $J_c$ of a Josephson junction remains at a high level.

To achieve at least one of the objects, a high-temperature superconductive device including a ramp-edge junction is proposed, according to the present invention, the ramp-edge junction comprising:

a first electrode layer that defines the size of the ramp-edge junction; and a second electrode layer;

wherein the width of the second electrode layer is greater than the width of the first electrode layer; and the first electrode layer and the second electrode layer touch in part, and are separated via a first insulation layer in remaining parts.

Because the ramp-edge junction includes the first electrode layer and the second electrode layer, the inductance of the ramp-edge junction can be reduced with the critical current density $J_c$ being kept at a high level. Accordingly, the parasitic inductance in the high-temperature superconductive device can be reduced, and the performance thereof can be improved.

Other objects, features, and advantages of the present invention will become more apparent from the following detailed description when read in conjunction with the accompanying drawings.

DETAILED DESCRIPTION OF THE PREFERRED EMBODIMENTS

Figure 1A:
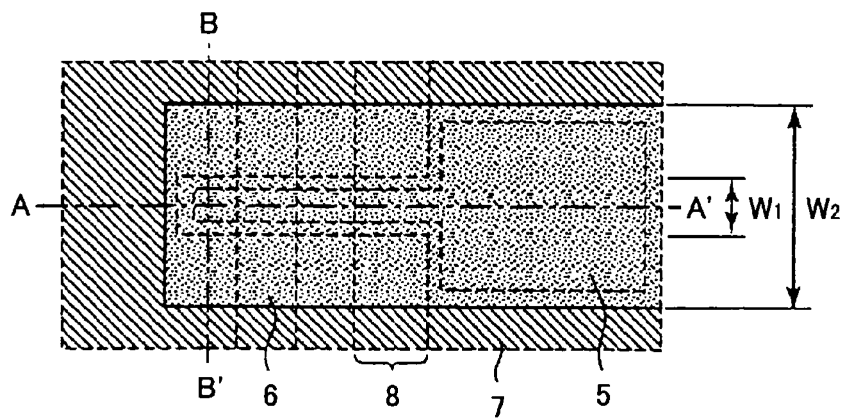
FIGS. 1A-1C are schematic diagrams for explaining the principle of the present invention.
Figure 1B:
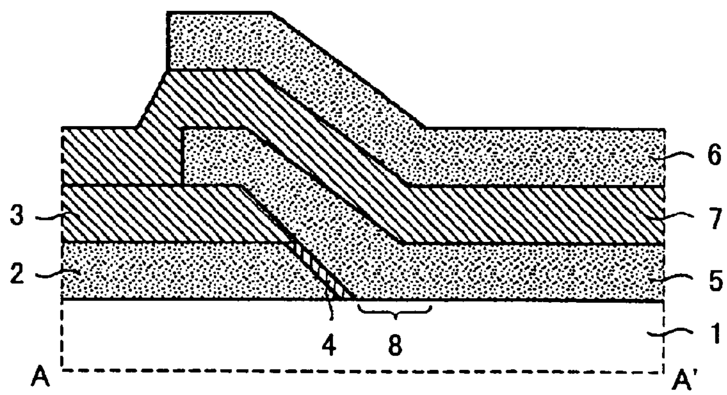
Figure 1C:
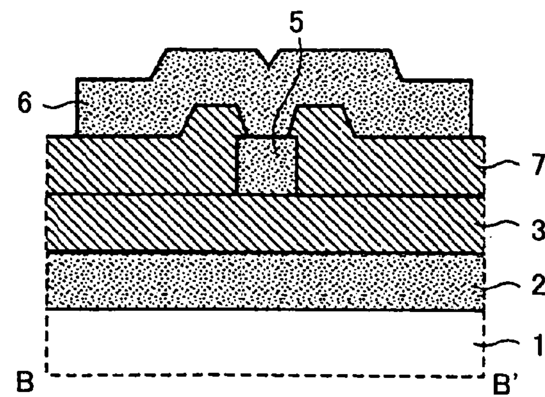

FIGS. 1A-1C are schematic diagrams for explaining the principle of the present invention. FIG. 1A is a top view of a high-temperature superconductive device according to an embodiment of the present invention. FIG. 1B is a cross-sectional view along a one-dot chain line A-A' shown in FIG. 1A. FIG. 1C is a cross-sectional view along a one-dot chain line B-B' shown in FIG. 1A. Reference numeral "3" indicates an interlayer insulating layer made of $SrSnO_3$, for example.

The high-temperature superconductive device according to an embodiment includes ramp-edge junctions, at least one of the ramp-edge junctions further including a first electrode layer 5 that defines the size of the junction, and a second electrode layer 6 that is larger in width than the first electrode layer 5. The first electrode layer 5 and the second electrode layer 6 touch in part, and are separated by an insulation layer 7 in other parts.

The relatively more narrow first electrode layer 5 defines the width of a bridge 8, and as a result, the critical current density $J_c$ becomes high. The relatively wider second electrode layer 6 that touches the first electrode layer 5 in part reduces inductance. Accordingly, the performance of the high-temperature superconductive device can be improved.

The first electrode layer 5 and the second electrode layer 6 may be provided at a position more distant from a substrate 1 than another electrode layer 2 forming the ramp-edge junction. Alternatively, the first electrode layer 5 and the second electrode layer 6 may be provided at a position less distant from the substrate 1 than the other electrode layer 2.

A superconductive layer may be provided as a ground plane between the ramp-edge junction and the substrate 1, the superconductive layer being separated from the ramp-edge junction by the insulation layer. Alternatively, a surface of the ramp-edge junction opposite the substrate 1 may be coated with a superconductor layer as a ground plane, the superconductor layer separated from the ramp-edge junction by the insulation layer. The ground plane can further reduce the inductance.

A barrier layer 4 forming the ramp-edge junction may be an interface-modified layer formed by damaging the ramp with Ar ion irradiation, for example, or a deposition layer made of $CeO_2$, for example.

The process for fabricating a high-temperature superconductive device preferably includes a step of flattening at least as a part of the steps of forming the electrode layers 2, 5, and 6 and forming the insulation layer 7. The flattening prevents any salient from being included in the electrode layers 2, 5, 6 and the insulation layer 7.

A process for fabricating an interface-modified ramp-edge junction according to a first embodiment of the present invention is described with reference to FIGS. 2A-2I.

Figure 2A:
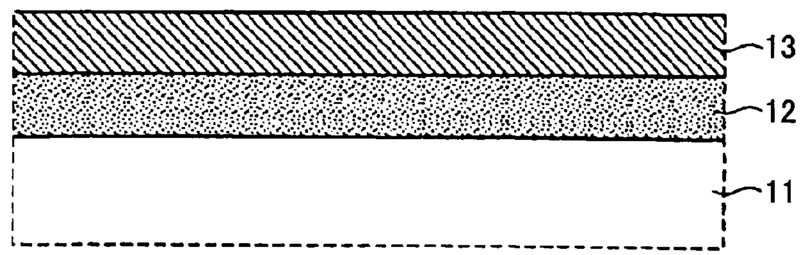
FIGS. 2A-2I are schematic diagrams showing a process for forming an interface-modified ramp-edge junction as an embodiment.

As shown in FIG. 2A, A lower electrode layer 12 and an insulation layer 13 are deposited on a LSAT substrate 11 in that order using a pulsed laser deposition (PLD) method. The LSAT substrate 11 is made of $[LaAlO_3]_{0.3}[Sr(Al,Ta)O_3]_{0.7}$. The lower electrode layer 12 is made of, for example, YBCO ($YBa_2Cu_3O_{7-x}$) of 200 nm thickness. The insulation layer 13 is made of, for example, $SrSnO_3$ of 300 nm thickness.

Figure 2B:
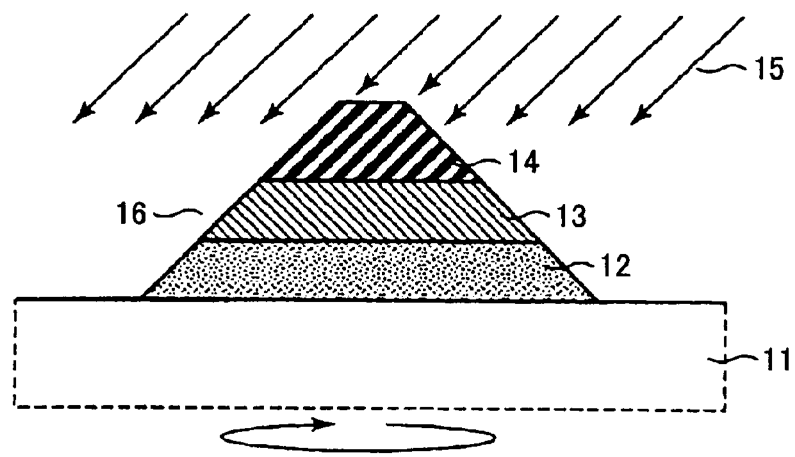

As shown in FIG. 2B, photoresist is applied on the insulation layer 13, and is exposed and developed. Then, the photoresist is baked, and the baked photoresist film is reflowed thereby to form a photoresist pattern 14. The photoresist pattern 14 is used as a mask. While the LSAT substrate 11 is rotated, Ar ions 15 are applied to the LSAT substrate 11 from a slant direction for two minutes to etch the insulation layer 13 and the lower electrode layer 12. As a result, ramps 16 are formed.

Figure 2C:
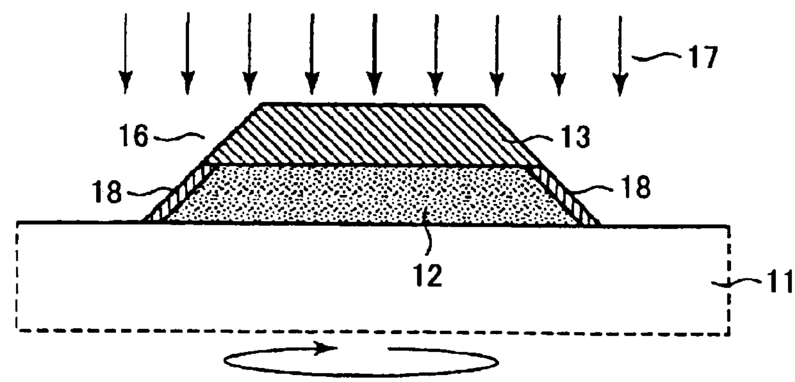

As shown in FIG. 2C, the photoresist pattern 14 is removed. While the LSAT substrate 11 is rotated, Ar ions 17 are applied to the LSAT substrate 11 in a direction perpendicular to the LSAT substrate 11 thereby to form a damaged layer 18 on the ramps 16.

Figure 2D:
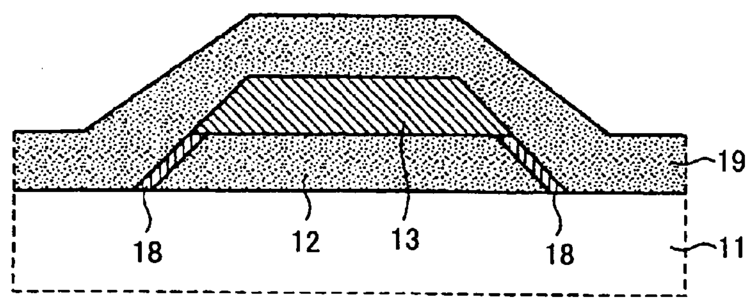

As shown in FIG. 2D, the LSAT substrate 11 is put in a vacuum chamber for PLD. The LSAT substrate 11 is heated in an oxygen environment up to a temperature at which an upper electrode layer is deposited. YBCO of 200 nm thickness, for example, is deposited as a upper electrode layer 19.

Figure 2E:
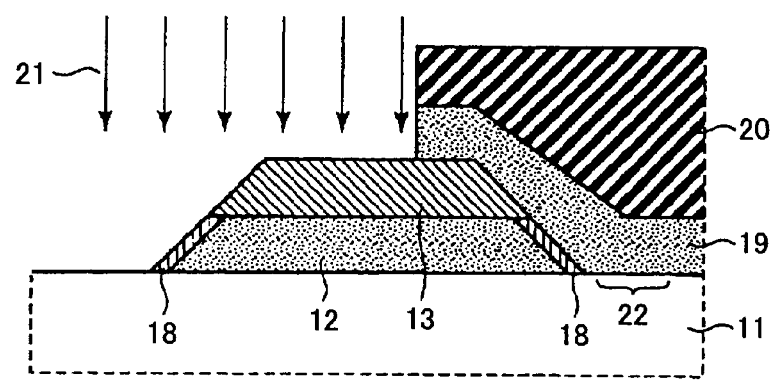

As shown in FIG. 2E, using a photoresist pattern 20 as a mask, Ar ions 21 are applied thereby to make the upper electrode layer 19 of width $W_1$ so as to obtain a desired critical current density and to form a Josephson junction having a desired $L \times I_c$ product or a desired $I_c \times R_n$ product.

Figure 2F:
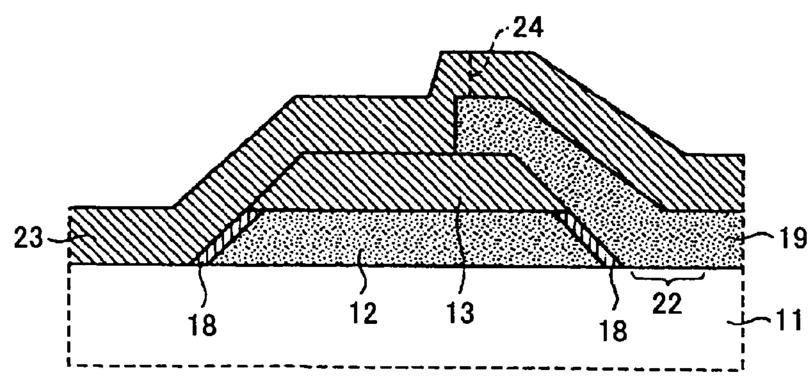

As shown in FIG. 2F, an insulation layer 23 made of $SrSnO_3$ is deposited on the entire surface of the LSAT substrate 11. After the insulation layer 23 is deposited, Ar ions are applied using a photoresist pattern (not shown) as a mask thereby to form an opening part 24 having a step corresponding to the shape of the upper electrode layer 19.

Figure 2G:
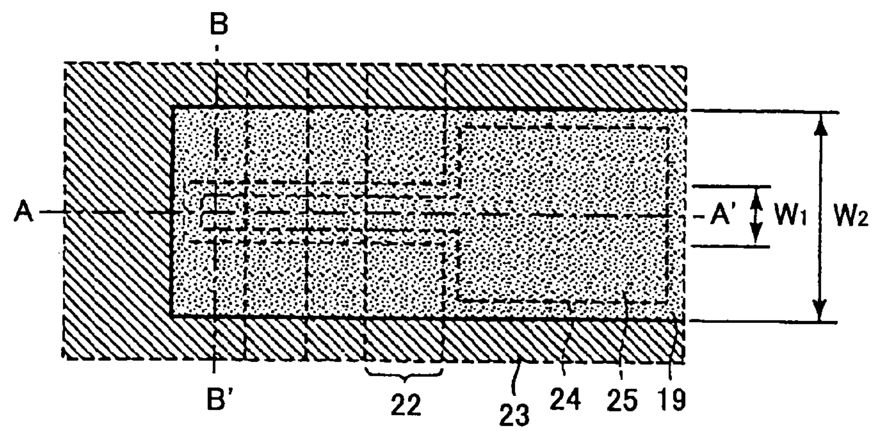
Figure 2H:
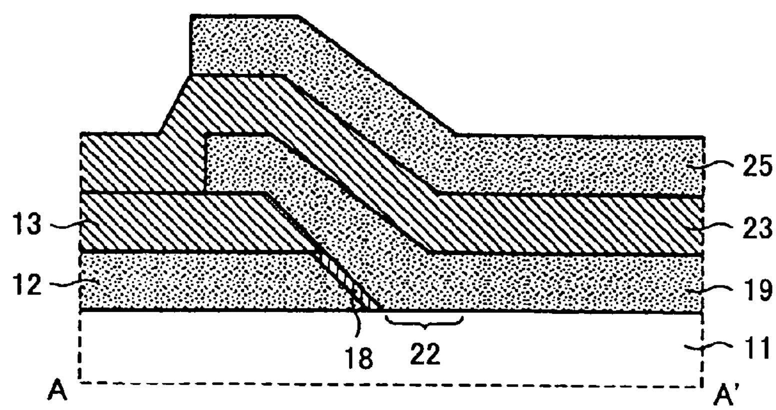
Figure 2I:
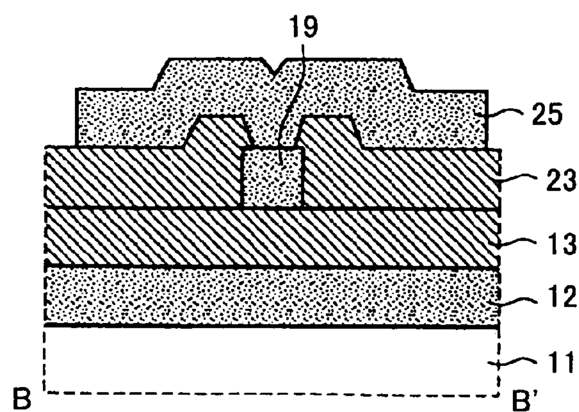

FIG. 2G is a top view showing the interface-modified ramp-edge junction according to the first embodiment. FIG. 2H is a cross-sectional view along a one-dot chain line A-A' shown in FIG. 2G. FIG. 2I is a cross-sectional view along a one-dot chain line B-B' shown in FIG. 2I.

An over electrode layer 25 made of, for example, 200 nm-thick YBCO is deposited using the PLD method. After the over electrode layer 25 is deposited, the over electrode layer 25 is patterned with an Ar ion application using a photoresist pattern (not shown) as a mask thereby to form the ramp-edge junction having the dual-layered upper electrode.

The width $W_2$ of the over electrode layer 25 is made greater than the width $W_1$ of the upper electrode layer 19 in the bridge unit 22. The width of the over electrode layer 25 is $W_2$=10 μm, for example.

As described above, according to the first embodiment of the present invention, the upper electrode is dual-layered. The width $W_1$ of the bridge unit 22 of the upper electrode layer 19 forming the junction is made small so as to make the critical current density $J_c$ of the Josephson junction at a high level. On the other hand, the width $W_2$ of the bridge unit 22 of the over electrode layer 25 touching the upper electrode layer 19 is made greater so as to reduce the inductance.

Figure 3:
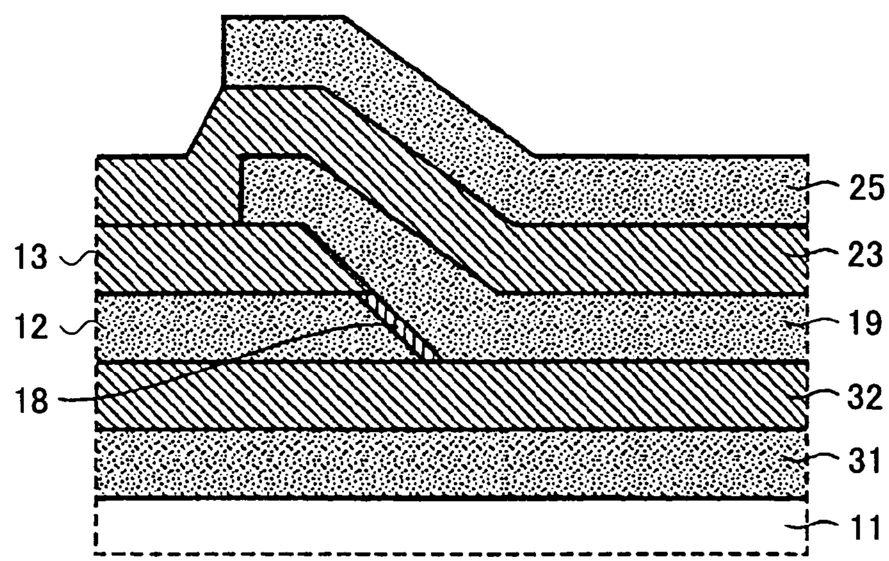
FIG. 3 is a cross-sectional view of an interface-modified ramp-edge junction according to a second embodiment.

Next, with reference to FIG. 3, an interface-modified ramp-edge junction according to a second embodiment of the present invention is described. The basic structure thereof is similar to that of the first embodiment. Accordingly, only a cross-sectional view of the interface-modified ramp-edge junction according to the second embodiment is shown in FIG. 3.

As shown in FIG. 3, a ground plane 31 and an insulation layer 32 are deposited on the LSAT substrate 11 in that order using the PLD method. The ground plane 31 may be made of, for example, 200 nm-thick YBCO. The insulation layer 32 may be made of, for example, 300 nm-thick $SrSnO_3$. After the ground plane 31 and the insulation plane 32 are formed on the LSAT substrate 11, a process similar to that of the first embodiment is performed.

According to the second embodiment, the ground plane 31 further reduces the inductance in addition to the reduction made by the over electrode layer 25.

An interface-modified ramp-edge junction according to a third embodiment of the present invention is described with reference to FIG. 4. The basic structure thereof is similar to that of the first embodiment. Accordingly, only a cross-sectional view of the interface-modified ramp-edge junction according to the third embodiment is shown in FIG. 4.

Figure 4:
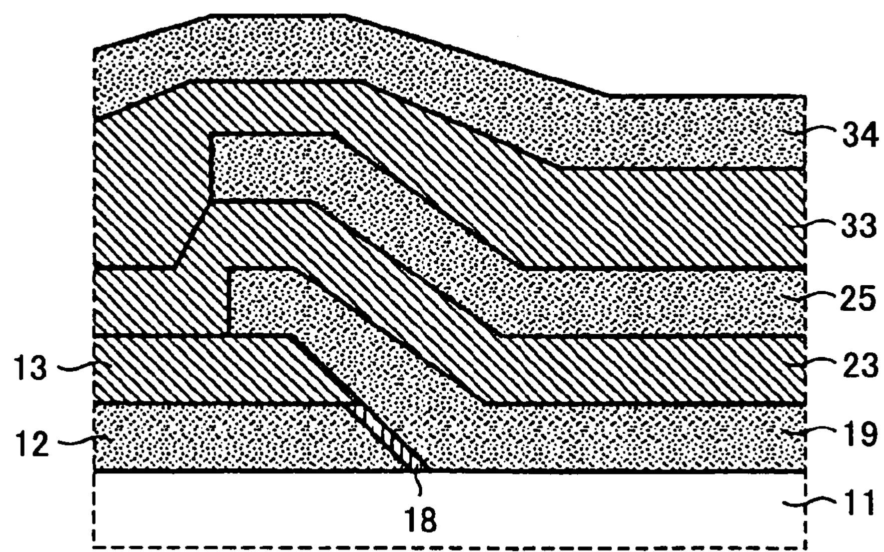
FIG. 4 is a cross-sectional view of an interface-modified ramp-edge junction according to a third embodiment.

As shown in FIG. 4, according to the third embodiment, after performing the process shown in FIGS. 2A-2I, an insulation layer 33 and a ground plane 34 are deposited using the PLD method in that order. The insulation layer 33 may be made of, for example, 400 nm-thick $SrSnO_3$, and the ground plane 34 may be made of, for example, 600 nm-thick YBCO.

According to the third embodiment, the ground plane 34 further reduces the inductance in addition to the reduction made by the over electrode layer 25.

An interface-modified ramp-edge junction according to a fourth embodiment is described with reference to FIGS. 5A-5C.

Figure 5A:
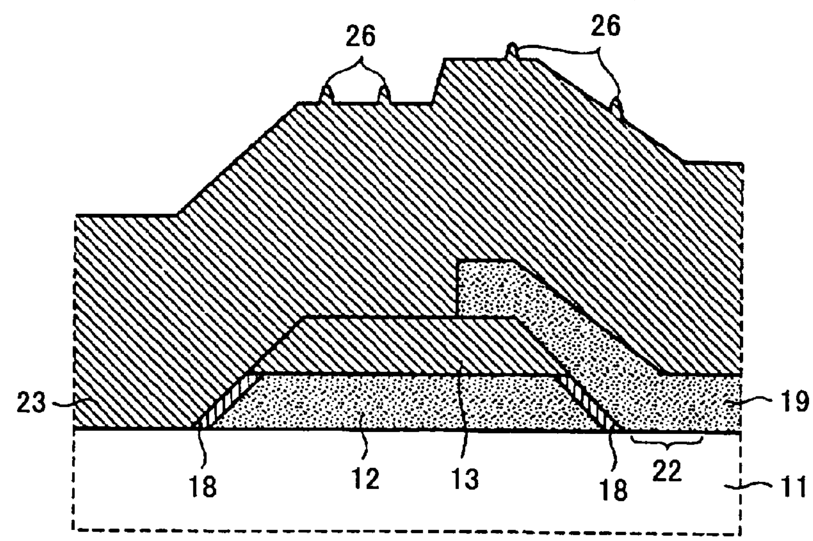
FIGS. 5A-5C are schematic diagrams showing a process for forming an interface-modified ramp-edge junction as a fourth embodiment.

After performing the process shown in FIGS. 2A-2F in which the lower electrode layer 12, the insulation layer 13, the damaged layer 18, and the upper electrode layer 19 having the bridge unit 22 are formed, an insulation layer 23 made of, for example, 800 nm-thick $SrSnO_3$ using the PLD method as shown in FIG. 5A is formed.

Figure 5B:
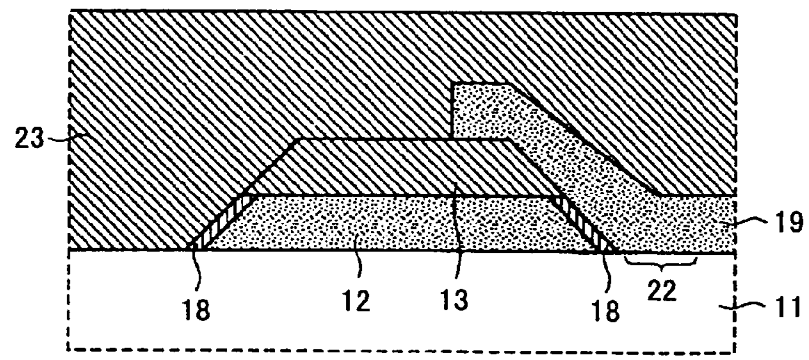

As shown in FIG. 5B, the insulation layer 23 is made flat by polishing with $Al_2O_3$, for example.

Figure 5C:
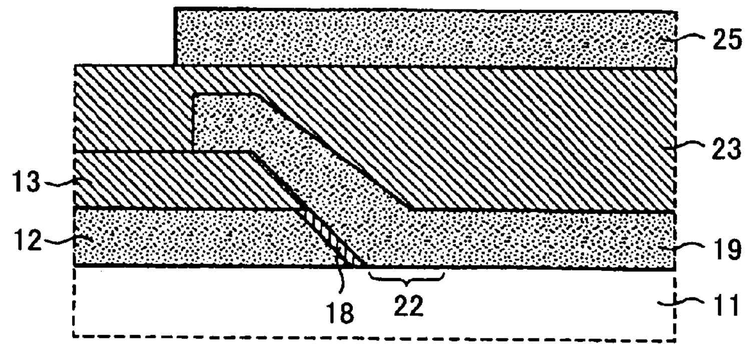

As shown in FIG. 5C, after making the insulation layer 23 flat, an opening part is formed along the shape of the upper electrode layer 19 in the same manner as the first embodiment by applying Ar ions using a photoresist pattern (not shown) as a mask. After forming the opening part, an over electrode layer 25 made of, for example, 500 nm-thick YBCO is deposited using the PLD method. After depositing the over electrode layer 25, the over electrode layer is patterned by applying Ar ions using a photoresist pattern (not shown) as a mask thereby to form a ramp-edge junction having a dual-layered upper electrode.

As described above, according to the fourth embodiment, since the insulation layer 23 is made flat, salients 26 formed on the surface of the insulation layer 23 can be removed, and are prevented from affecting the over electrode layer 25.

Since the opening part is formed after the insulation layer 23 is made flat, the interface between the upper electrode layer 19 and the over electrode layer 25 can be controlled at high accuracy. A ground plane can be provided over the upper electrode layer 19 and the over electrode layer 25 in a suitable and similar manner to the above third embodiment.

A process for fabricating a ramp-edge junction according to a fifth embodiment of the present invention is explained with reference to FIGS. 6A-6F.

Figure 6A:
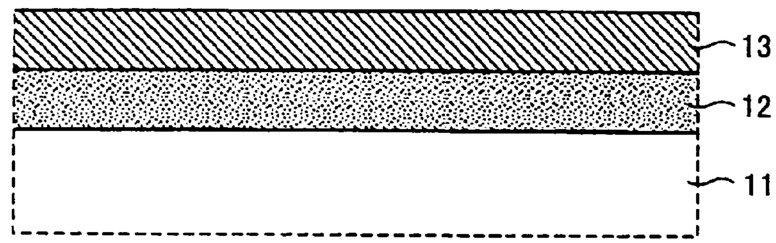
FIGS. 6A-6F are schematic diagrams showing a process for forming an interface-modified ramp-edge junction as a fifth embodiment.

As shown in FIG. 6A, the lower electrode layer 12 made of, for example, 200 nm-thick YBCO and the insulation layer 13 made of, for example, 300 nm-thick $SrSnO_3$ are deposited on the LSAT substrate 11 in that order using the PLD method.

Figure 6B:
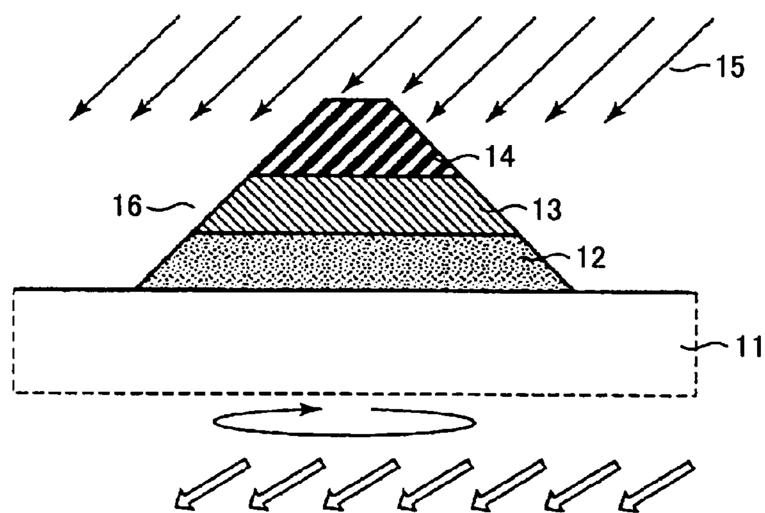

As shown in FIG. 6B, photoresist is applied on the insulation layer 13. After the photoresist is exposed and developed, the photoresist is baked and reflowed thereby to form the photoresist pattern 14. The photoresist pattern 14 is used as the mask. While the LSAT substrate 11 is rotated, Ar ions 15 are applied from a slant direction thereby to etch the oxide insulation layer 13 and the lower electrode layer 12, and to form the ramps 16.

Figure 6C:
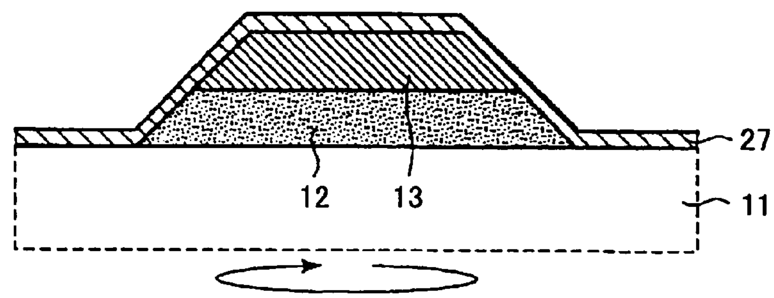

After the photoresist pattern 14 is removed, while the LSAT substrate 11 is rotated, 30 nm-thick PBCO ($PrBaCu_3O_{7-x}$), for example, is laser-deposited as a barrier layer 27 from a direction forming an angle of 30 degree with the LSAT substrate surface as shown in FIG. 6C.

Figure 6D:
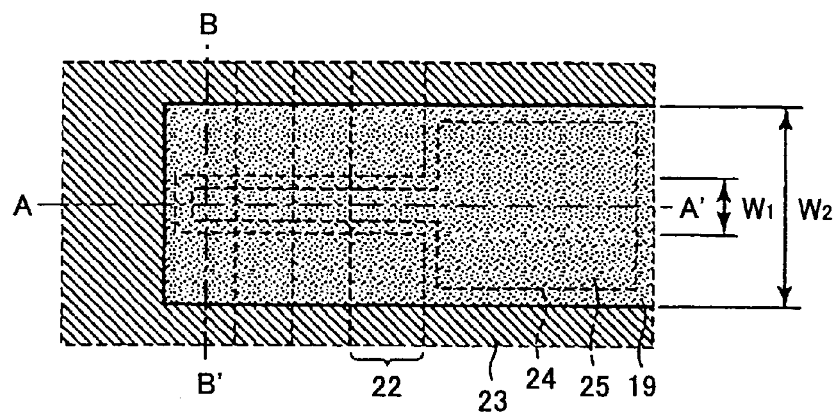
Figure 6E:
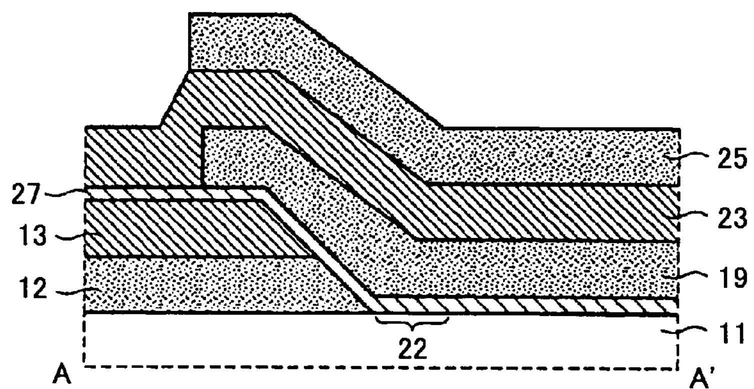
Figure 6F:
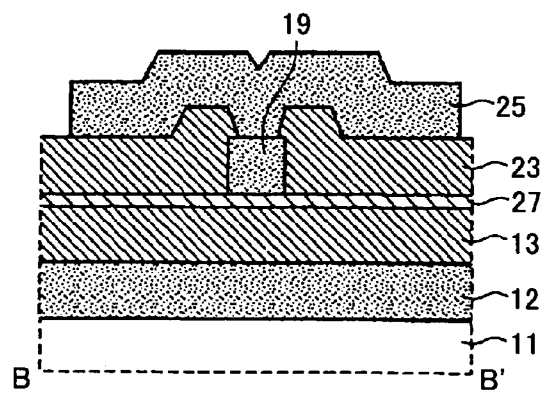
Figure 7:
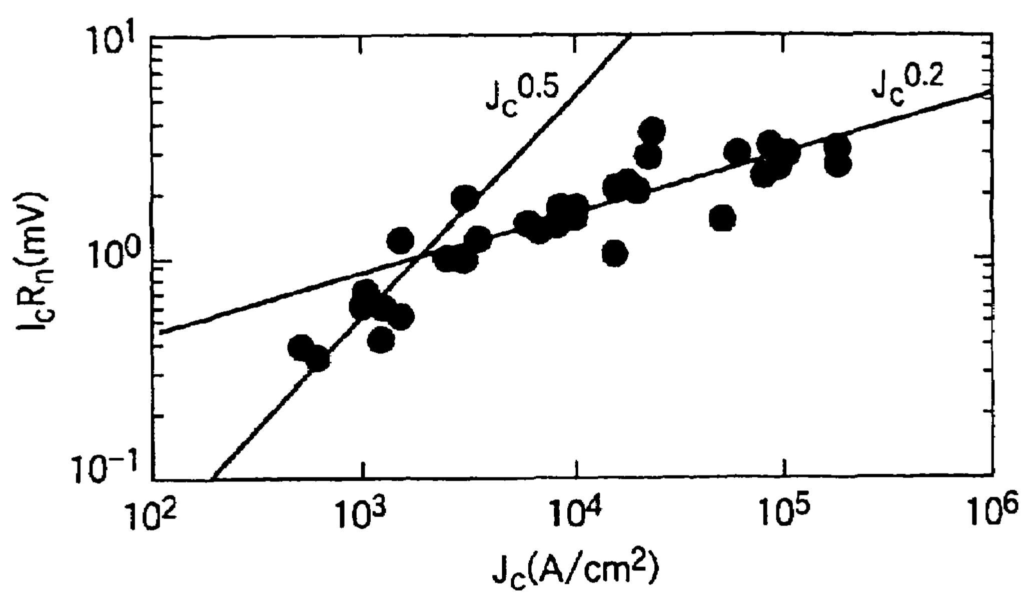
FIG. 7 is a graph showing the relation between an $I_c \times R_n$ product and $J_c$.
Figure 8A:
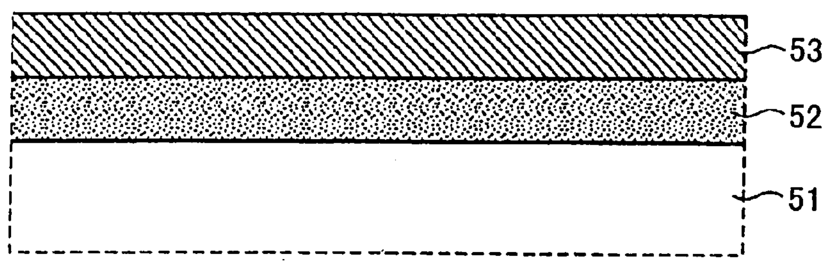
FIGS. 8A-8G are schematic diagrams showing a process for forming a conventional interface-modified ramp-edge junction.
Figure 8B:
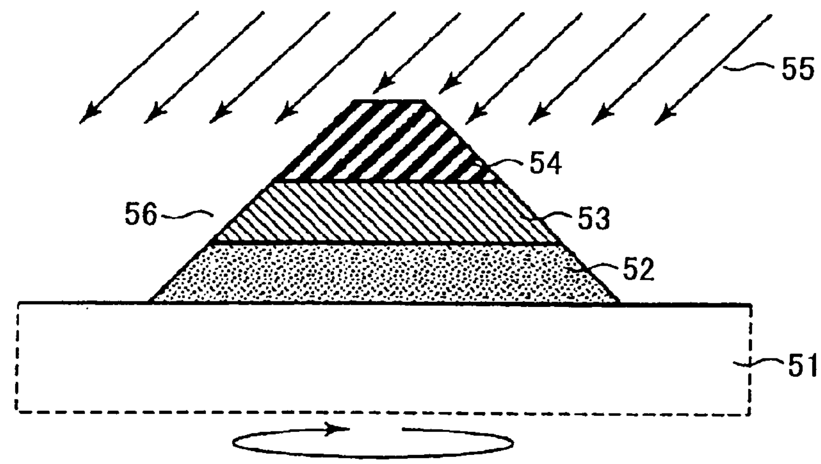
Figure 8C:
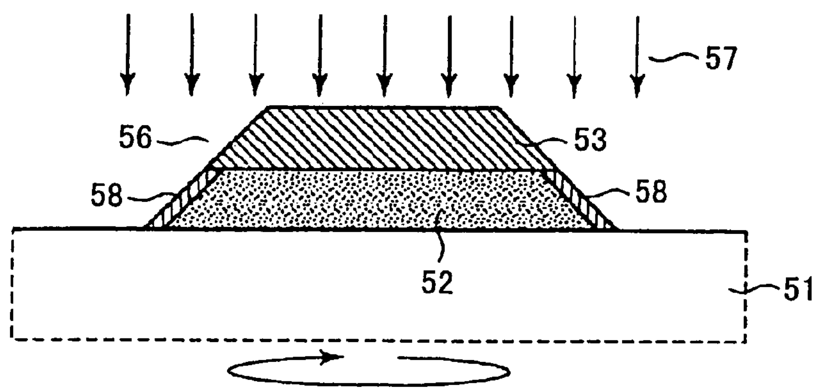
Figure 8D:
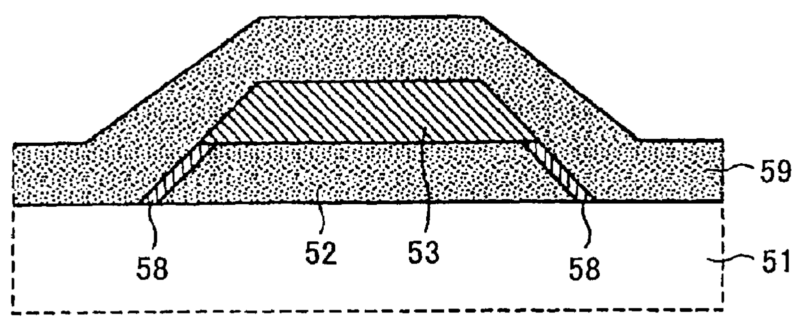
Figure 8E:
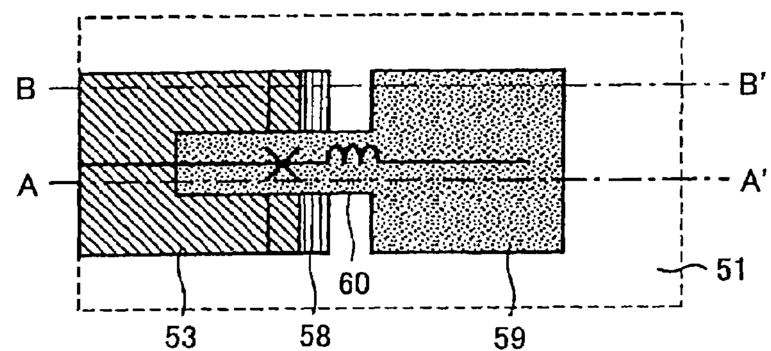
Figure 8F:
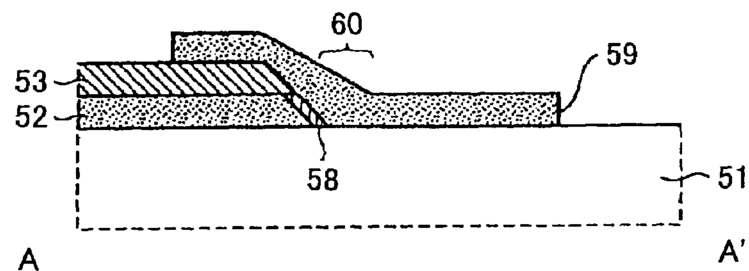
Figure 8G:
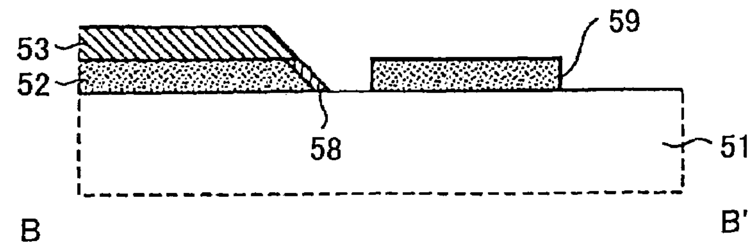
Figure 9A:
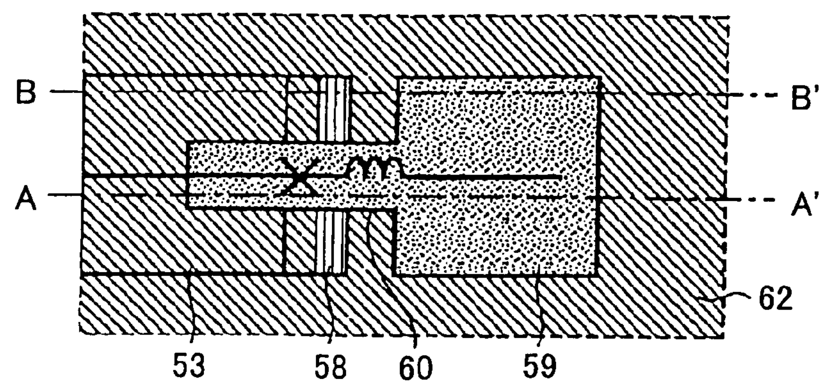
FIGS. 9A-9C are schematic diagrams for explaining a conventional interface-modified ramp-edge junction in which a ground plane is provided.
Figure 9B:
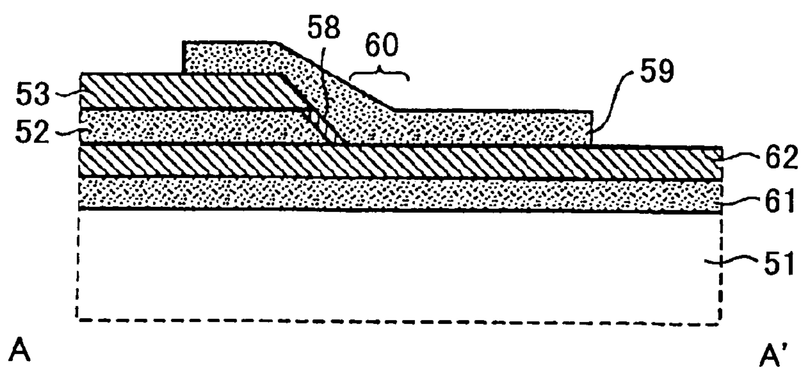
Figure 9C:
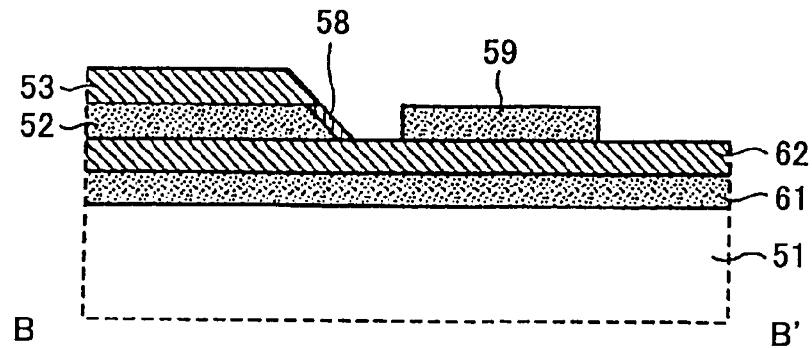

FIG. 6D is a top view of the ramp-edge junction according to the fifth embodiment. FIGS. 6E and 6F are cross-sectional views along a one-dot chain lines A-A' and B-B', respectively, shown in FIG. 6D.

After the barrier layer 27 is formed, the LSAT substrate 11 is put in the vacuum chamber of a PLD apparatus, and is heated up to a temperature at which the upper electrode layer is deposited in an oxygen environment. Then, the upper electrode layer 19 made of 200 nm-thick YBCO, for example, is deposited.

After the upper electrode layer 19 is deposited, a photoresist pattern (not shown) is formed as a mask, and Ar ions are applied. The upper electrode layer 19 is patterned so that its width is made $W_1$ with which a desired critical current density can be obtained, and the bridge unit 22 is formed so that a Josephson junction having a desired $L \times I_c$ product or a desired $I_c \times R_n$ product can be formed.

After the bridge unit 22 is formed, an insulation layer 23 made of $SrSnO_3$ is formed on the entire surface of the LSAT substrate 11. A photoresist pattern (not shown) is formed as a mask and Ar ions are applied thereby to form an opening unit 24 along the shape of the upper electrode layer 19.

After the opening part 24 is formed, an over electrode layer 25 made of 200 nm-thick YBCO, for example, is deposited using the PLD method. After the over electrode layer 25 is deposited, the photoresist pattern (not shown) is formed and Ar ions are applied thereby to pattern the over electrode layer 25 into a predetermined shape. As a result, a ramp-edge junction with a dual-layer upper electrode is completed.

As described above, in the case of a ramp-edge junction of which the barrier layer is formed by deposition, the upper electrode layer is made dual-layered and the width $W_1$ of the bridge unit 22 of the upper electrode layer 19 forming the junction is made narrow thereby to make the critical current density $J_c$ of the Josephson junction at a high level. Since the width $W_2$ of the bridge unit 22 of the over electrode layer 25 facing the upper electrode layer 19 is made great, the inductance of the junction can be reduced.

The present invention is not limited to these embodiments, but various variations and modifications may be made without departing from the scope of the present invention.

In the above embodiments, the LSAT substrate made of $[LaAlO_3]_{0.3}[Sr(Al,Ta)O_3]_{0.7}$ is used, however, other material such as MgO and $SrTiO_3$ may be used.

In the above embodiments, the lower electrode layer and the upper electrode layer are made of YBCO ($YBa_2Cu_3O_{7-x}$). However, the lower electrode layer can be configured with La-doped YBCO having a higher deposition temperature than YBCO. According to this arrangement, the deposition of the upper electrode layer can be prevented from affecting the structure that has been formed on the substrate.

The material of the lower electrode layer and the upper electrode layer is not limited to YBCO and La-doped YBCO. Other materials such as $YbBa_2Cu_3O_{7-x}$ and $REBa_2Cu_3O_{7-x}$ may be used. "RE" indicates an element or multiple elements in the lanthanide series other than Pr, Pm, Tb, and Ce. $REBa_2Cu_3O_{7-x}$ includes RE, Ba, and Cu at a ratio of RE:Ba:Cu=1:2:3.

In the above embodiments, the material of the interlayer insulation layer includes, but is not limited to, $SrSnO_3$. Other materials such as LSAT, MgO, $CeO_2$, and $SrTiO_3$ may be used.

In the fifth embodiment, the barrier layer is made of PBCO ($PrBa_2Cu_3O_{7-x}$). However, the barrier layer may be made of other material such as $PrBa_2Cu_{3-x}Ga_xO_y$.

Furthermore, only a basic structure of the fifth embodiment has been described. The ground plane, however, may be provided at the substrate side in the same manner as the second embodiment. Alternatively, the ground plane may be provided over the over electrode layer via an insulation layer in the same manner as the third embodiment. The fabrication process of the fifth embodiment may include a step of making the insulation layer flat in the same manner as the fourth embodiment.

In the above embodiments, the PLD method has been used to deposit YBCO, $SrSnO_3$, or PBCO films. However, another method such as the sputtering method may be used instead.

In the first through fourth embodiments, Ar ions are applied to form the damaged layer; however, Ne, Kr, Xe ions, for example, may be applied.

In the fourth embodiment, polishing is performed mechanically using $Al_2O_3$. However, polishing may be performed using another method such as the bias sputtering method.

In the fourth embodiment, only the insulation layer for forming the over electrode layer has been polished. However, polishing may be performed after forming the lower electrode layer, the interlayer insulation layer, or the upper electrode layer. Especially, if the upper electrode layer is polished, the bias sputtering method is suitable. Salients on the upper electrode layer can be removed by the bias sputtering method.

In the above embodiments, the bridge unit is formed in the upper electrode layer and the upper electrode layer is made dual-layered. However, the structure may be formed upside down. That is, a wide over electrode layer may be formed on the substrate. Then, the lower electrode layer may be formed on the wide over electrode layer via an interlayer insulation layer having an opening unit. And, an insulation layer may be deposited on the lower electrode layer.

In this case, the insulation layer and the lower electrode layer may be shaped into a pattern having a stripe unit. A slope is formed at an open end of the stripe unit. A damaged layer may be formed on the slope by applying Ar ions. Alternatively, a deposition layer may be formed by depositing PBCO. Then, an upper electrode layer may be deposited thereon, and the upper electrode layer is shaped into a pattern with large width.

This patent application is based on Japanese Priority Patent Application No. 2003-202819 filed on Jul. 29, 2003, the entire contents of which are hereby incorporated by reference.

What is claimed is:

1. A high-temperature superconductive device including a ramp-edge junction, at least one of electrodes of the ramp-edge junction comprising:

a first electrode layer that defines the size of the ramp-edge junction; and a second electrode layer greater in width than the first electrode layer; wherein the first electrode layer and the second electrode layer touch each other in an area and are separated by a first insulation layer in the remaining area.

2. The high-temperature superconductive device as claimed in claim 1, the ramp-edge junction further comprising:

a third electrode layer;

wherein the first electrode layer and the second electrode layer are more distant from a substrate than the third electrode layer is.

3. The high-temperature superconductive device as claimed in claim 1, the ramp-edge junction further comprising:

a third electrode layer;

wherein the first electrode layer and the second electrode layer are closer to a substrate than the third electrode layer is.

4. The high-temperature superconductive device as claimed in claim 1, the ramp-edge junction further comprising:

a superconductive layer that functions as a ground plane, the superconductive layer provided between the ramp-edge junction and the substrate and separated from the ramp-edge junction by a second insulation layer.

5. The high-temperature superconductive device as claimed in claim 1, the ramp-edge junction further comprises:

a superconductive layer that operate as a ground plane, the superconductive layer coating a surface of the ramp-edge junction opposite the substrate, and being separated by a third insulation layer.

6. The high-temperature superconductive device as claimed in claim 1, the ramp-edge junction further comprises:

a barrier layer made of a modified surface layer formed by applying ions or a deposition layer.

* * * * *